US009209049B2

(12) United States Patent
Sorabji et al.

(10) Patent No.: US 9,209,049 B2
(45) Date of Patent: Dec. 8, 2015

(54) RAPID CONDUCTIVE COOLING USING A SECONDARY PROCESS PLANE

(71) Applicant: Applied Materials, Inc., Santa Clara, CA (US)

(72) Inventors: Khurshed Sorabji, San Jose, CA (US); Alexander N. Lerner, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/189,696

(22) Filed: Feb. 25, 2014

(65) Prior Publication Data

US 2014/0199786 A1 Jul. 17, 2014

Related U.S. Application Data

(60) Continuation of application No. 13/538,124, filed on Jun. 29, 2012, now Pat. No. 8,658,947, which is a continuation of application No. 12/887,407, filed on Sep. 21, 2010, now Pat. No. 8,227,729, which is a continuation of application No. 11/925,600, filed on Oct. 26, 2007, now Pat. No. 7,812,286, which is a division of application No. 11/611,061, filed on Dec. 14, 2006, now Pat. No. 7,378,618.

(51) Int. Cl.
| H01L 21/00 | (2006.01) |
| H01L 21/67 | (2006.01) |
| C30B 31/14 | (2006.01) |
| H01L 21/30 | (2006.01) |
| H01L 21/66 | (2006.01) |

(52) U.S. Cl.
CPC .......... *H01L 21/67098* (2013.01); *C30B 31/14* (2013.01); *H01L 21/30* (2013.01); *H01L 21/67109* (2013.01); *H01L 21/67115* (2013.01); *H01L 22/10* (2013.01); *H01L 2924/0002* (2013.01)

(58) Field of Classification Search
CPC .............. H01L 21/67098; H01L 21/30; H01L 21/67109; H01L 21/67115; H01L 22/10; H01L 2924/0002; H01L 2924/00; C30B 31/14; C30B 31/18; C30B 31/12
See application file for complete search history.

(56) References Cited

U.S. PATENT DOCUMENTS 5,609,689 A 3/1997 Kato et al.
5,802,856 A 9/1998 Schaper et al.
(Continued)

FOREIGN PATENT DOCUMENTS

JP 63-269515 A 11/1988
JP H01123321 A 5/1989
(Continued)

OTHER PUBLICATIONS

Second Office Action dated May 6, 2011 for Chinese Application No. 2007101635933.
(Continued)

*Primary Examiner* — Shawntina Fuqua
(74) *Attorney, Agent, or Firm* — Patterson & Sheridan, LLP

(57) ABSTRACT

In one embodiment, a substrate processing apparatus includes a chamber having an interior volume with an upper portion and a lower portion, a cooling source disposed in the upper portion of the interior volume, a heating source opposing the cooling source, a magnetically movable substrate support that moves between the upper portion and the lower the portion, and a plurality of sensors coupled to the chamber to detect the position of the substrate support relative to the heating source and the cooling source.

16 Claims, 4 Drawing Sheets

(56) References Cited

U.S. PATENT DOCUMENTS

| | | | |
|---|---|---|---|
| 5,818,137 A | 10/1998 | Nichols et al. | |
| 5,871,588 A | 2/1999 | Moslehi et al. | |
| 6,049,148 A | 4/2000 | Nichols et al. | |
| 6,074,696 A | 6/2000 | Sato | |
| 6,097,005 A * | 8/2000 | Akimoto | 219/444.1 |
| 6,110,283 A | 8/2000 | Yamamuka et al. | |
| 6,157,106 A | 12/2000 | Tietz et al. | |
| 6,172,337 B1 | 1/2001 | Johnsgard et al. | |
| 6,323,496 B1 | 11/2001 | Sakase et al. | |
| 6,355,909 B1 | 3/2002 | Griffiths et al. | |
| 6,410,888 B2 | 6/2002 | Pan | |
| 6,464,825 B1 * | 10/2002 | Shinozaki | 156/345.55 |
| 6,477,787 B2 | 11/2002 | Morad et al. | |
| 6,514,073 B1 * | 2/2003 | Toshima et al. | 432/85 |
| 6,544,338 B1 | 4/2003 | Batchelder et al. | |
| 6,609,909 B2 | 8/2003 | Aoki et al. | |
| 6,658,763 B2 | 12/2003 | Morad et al. | |
| 6,770,851 B2 | 8/2004 | Granneman et al. | |
| 6,800,833 B2 * | 10/2004 | Gregor et al. | 219/390 |
| 6,809,035 B2 | 10/2004 | Yoo | |
| 6,888,104 B1 | 5/2005 | Ranish et al. | |
| 7,098,157 B2 | 8/2006 | Funk | |
| 7,378,618 B1 | 5/2008 | Sorabji et al. | |
| 7,812,286 B2 | 10/2010 | Sorabji et al. | |
| 8,227,729 B2 | 7/2012 | Sorabji et al. | |
| 2002/0104619 A1 | 8/2002 | Koren et al. | |
| 2003/0183611 A1 | 10/2003 | Gregor et al. | |
| 2005/0191044 A1 | 9/2005 | Aderhold et al. | |
| 2005/0260835 A1 | 11/2005 | Sha et al. | |
| 2011/0002674 A1 | 1/2011 | Shimizu et al. | |

FOREIGN PATENT DOCUMENTS

| | | |
|---|---|---|
| JP | 1-276623 A | 11/1989 |
| JP | 7-78831 A | 3/1995 |
| JP | 8-316157 A | 11/1996 |
| JP | 11-513880 A | 11/1999 |
| JP | 2000-515331 A | 11/2000 |
| JP | 2002-217183 A | 8/2002 |
| JP | 2002-252180 A | 9/2002 |
| JP | 2003142468 A | 5/2003 |
| JP | 2004-503074 A | 1/2004 |
| JP | 2004079677 A | 3/2004 |
| JP | 2005-535129 A | 11/2005 |
| KR | 2002-003425 | 5/2002 |
| KR | 20050038763 | 4/2005 |
| KR | 2005-0062520 | 6/2005 |
| WO | 99/19530 A1 | 4/1999 |
| WO | 2005083752 A2 | 9/2005 |

OTHER PUBLICATIONS

Notice to File a Response issued Apr. 27, 2009 in Korean Application No. 10-2007-0102466.
Partial European Search Report mailed May 26, 2008 (EP 07020053.0).
Extended European Search Report mailed Jul. 30, 2008. (EP 07020053.0).
Office Action Korean dated Dec. 7, 2012 for Application 10-2011-0058682.
Notice of Reasons for Rejection Office Action, dated Feb. 19, 2013, Japanese Application: 20007-265808.
Korean Office Action for Korean Application No. 10-2013-0113984 dated Nov. 11, 2013.
Japanese Office Action (with attached English translation) for Application No. 2013-207395 dated Oct. 21, 2014; 10 total pages.

* cited by examiner

RAPID CONDUCTIVE COOLING USING A SECONDARY PROCESS PLANE

CROSS-REFERENCE TO RELATED APPLICATIONS

This application is a continuation of U.S. patent application Ser. No. 13/538,124, filed Jun. 29, 2012, which issued as U.S. Pat. No. 8,658,947 on Feb. 25, 2014, which is a continuation of U.S. patent application Ser. No. 12/887,407, filed Sep. 21, 2010, which issued as U.S. Pat. No. 8,227,729 on Jul. 24, 2012, which is a continuation of U.S. patent application Ser. No. 11/925,600, filed Oct. 26, 2007, which issued as U.S. Pat. No. 7,812,286 on Oct. 12, 2010, which is a divisional of U.S. patent application Ser. No. 11/611,061, filed Dec. 14, 2006, which issued as U.S. Pat. No. 7,378,618 on May 27, 2008. Each of the aforementioned patent applications is incorporated herein by reference.

BACKGROUND OF THE INVENTION

1. Field of the Invention

Embodiments of the present invention generally relate to a method and apparatus for processing semiconductor substrates. More specifically, to a method and apparatus for thermally treating semiconductor substrates.

2. Description of the Related Art

Integrated circuits have evolved into complex devices that can include millions of transistors, capacitors, and resistors on a single chip. The evolution of chip design continually requires faster circuitry and greater circuit density that demand increasingly precise fabrication processes. One fabrication process frequently used is ion implantation.

Ion implantation is particularly important in forming transistor structures on semiconductor substrates and may be repeated many times during chip fabrication. During ion implantation, a semiconductor substrate, typically comprising a silicon material and/or a silicon containing film, is bombarded by a beam of electrically charged ions, commonly called dopants. Ion implantation changes the properties of the material in which the dopants are implanted in order to achieve a particular level of electrical performance. Dopant concentration may be determined by controlling the number of ions in a beam of energy projected on the substrate and the number of times the substrate passes through the beam. The dopants are accelerated to an energy level that will enable the dopants to penetrate the silicon material or implant into the film at a desired depth. The energy level of the beam typically determines the depth at which the dopants are placed.

During ion implantation, the implanted film may develop a high level of internal stress. In order to relieve the stress and further control the resulting properties of the implanted film, the film is typically subjected to a thermal process, such as annealing. Post-ion implantation annealing is typically performed in a rapid thermal processing (RTP) chamber that subjects the substrate to a very brief, yet highly controlled thermal cycle that can heat the substrate from room temperature to approximately 450° C. to about 1400° C. RTP typically minimizes or relieves the stress induced during implantation and can be used to further modify film properties, such as changing the electrical characteristics of the film by controlling dopant diffusion.

The RTP heating regime generally includes heating from a radiant heat source, such as lamps and/or resistive heating elements. In a conventional RTP system, the substrate is heated to a desired temperature, and then the radiant heat source is turned off, which causes the substrate to cool. In some systems, a gas may be flowed onto the substrate to enhance cooling. However, as processing parameters continue to evolve, temperature ramp up and heating uniformity during RTP requires closer monitoring and control. While conventional RTP chambers rely on the radiant heat source to rapidly heat the substrate to a desired temperature, the challenges arise when the substrate requires cooling to improve heating uniformity, and/or when the substrate needs to be rapidly cooled. For example, if a significant temperature gradient exists across the substrate, the substrate may plastically deform or warp, which may be detrimental to subsequent processes performed on the substrate. Further, the faster cooling and/or enhanced temperature control of the substrate may result in higher throughput and enhanced dopant uniformity.

Therefore, what is needed is an apparatus and method for rapid heating and cooling of a semiconductor substrate, with enhanced control of heat uniformity.

SUMMARY OF THE INVENTION

In one embodiment, a substrate processing apparatus includes a chamber having an interior volume with an upper portion and a lower portion, a cooling source disposed in the upper portion of the interior volume, a heating source opposing the cooling source, a magnetically movable substrate support that moves between the upper portion and the lower portion, and a plurality of sensors coupled to the chamber to detect the position of the substrate support relative to the heating source and the cooling source.

In another embodiment, a substrate processing apparatus includes a chamber having an interior volume with an upper portion and a lower portion, a cooling source disposed in the upper portion of the interior volume, a heating source opposing the cooling source, a levitating substrate support that moves between the upper portion and the lower portion, and a plurality of sensors coupled to the chamber to detect the position of the substrate support in the interior volume.

In another embodiment, a method for thermally treating a substrate includes providing a chamber having a levitating substrate support disposed therein, sensing a position of the substrate support within the chamber, adjusting the position of the substrate support within the chamber, moving the substrate to a first position, heating the substrate in the first position, moving the substrate to a second position adjacent an active cooling means, and cooling the substrate in the second position, wherein the first and second positions are disposed in the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
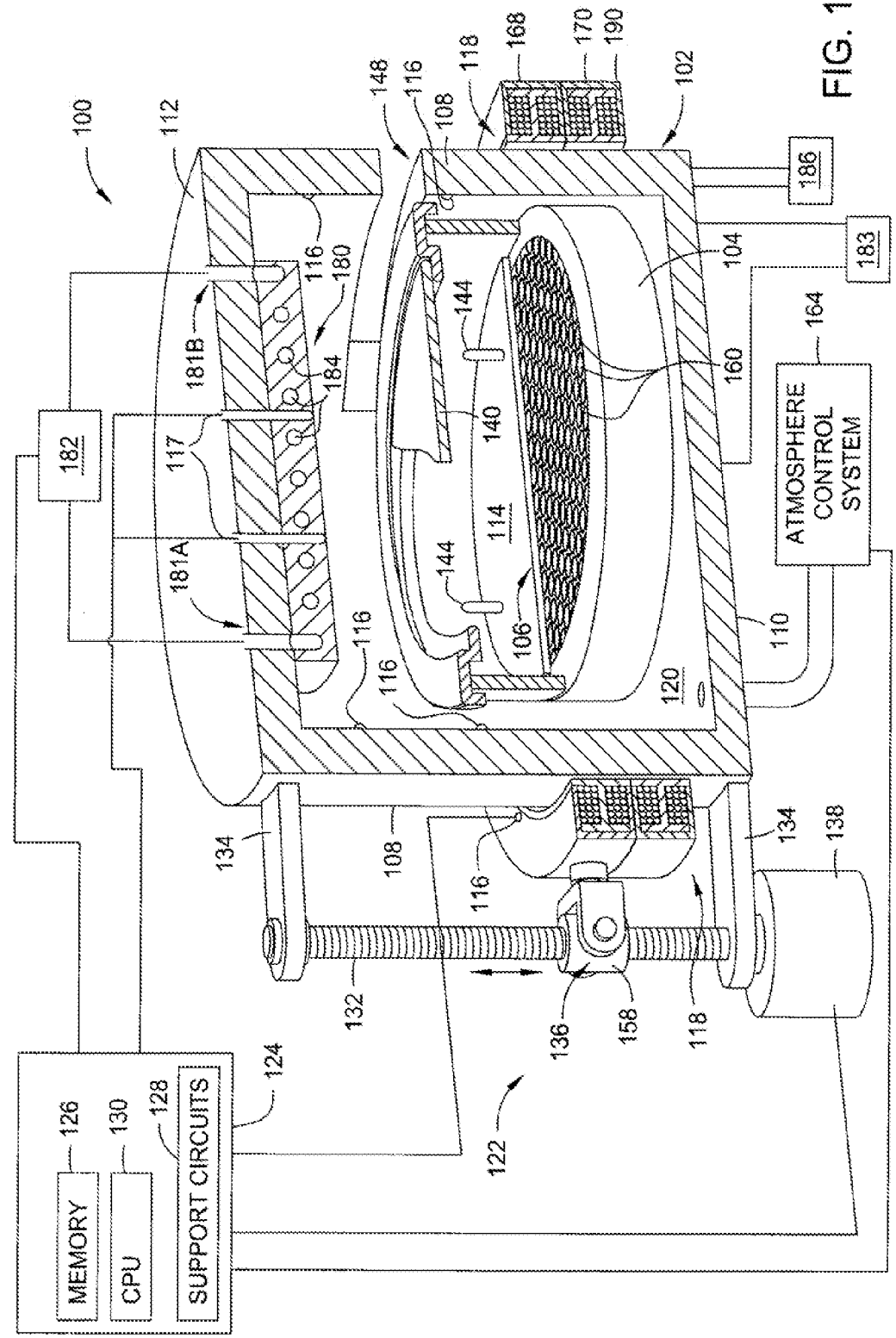
FIG. 1 is a simplified isometric view of one embodiment of a rapid thermal processing (RTP) chamber.

FIG. 1 is a simplified isometric view of one embodiment of a rapid thermal processing chamber 100. Examples of rapid thermal processing chambers that may be adapted to benefit from the invention are Quantum X plus and CENTURA® thermal processing systems, both available from Applied Materials, Inc., located in Santa Clara, Calif. Although the apparatus is described as utilized within a rapid thermal processing chamber, embodiments described herein may be utilized in other processing systems and devices where at least two temperature zones within one processing region is desired, such as substrate support platforms adapted for robot handoffs, orientation devices, deposition chambers, etch chambers, electrochemical processing apparatuses and chemical mechanical polishing devices, among others, particularly where the minimization of particulate generation is desired.

The processing chamber 100 includes a contactless or magnetically levitated substrate support 104, a chamber body 102, having walls 108, a bottom 110, and a top 112 defining an interior volume 120. The walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). In one embodiment, the substrate support 104 is annular and the chamber 100 includes a radiant heat source 106 disposed in an inside diameter of the substrate support 104. Examples of a RTP chamber that may be modified and a substrate support that may be used is described in U.S. Pat. No. 6,800,833, filed Mar. 29, 2002 and issued on Oct. 5, 2004 U.S. patent application Ser. No. 10/788,979, filed Feb. 27, 2004 and published as United States Patent Publication No. 2005/0191044 on Sep. 1, 2005, both of which are incorporated by reference in their entireties.

The substrate support 104 is adapted to magnetically levitate and rotate within the interior volume 120. The substrate support 104 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly 360 (shown in FIG. 3) coupled to a coolant source 183. The coolant source 183 may be one or a combination of water, ethylene glycol, nitrogen ($N_2$), and helium (He). The housing may be made of a copper material or other suitable material having suitable coolant channels formed therein for flow of the coolant from the coolant source 183. Each tube 160 may contain a reflector and a high-intensity lamp assembly or an IR emitter from which is formed a honeycomb-like pipe arrangement. This close-packed hexagonal arrangement of pipes provides radiant energy sources with high-power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by the controller 124 may varied to enhance the radial distribution of energy from the tubes 160. Dynamic control of the heating of the substrate 140 may be affected by the one or more temperature sensors 117 (described in more detail below) adapted to measure the temperature across the substrate 140.

A stator assembly 118 circumscribes the walls 108 of the chamber body 102 and is coupled to one or more actuator assemblies 122 that control the elevation of the stator assembly 118 along the exterior of the chamber body 102. In one embodiment (not shown), the chamber 100 includes three actuator assemblies 122 disposed radially about the chamber body, for example, at about 120° angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough 412 (shown in FIG. 4) that is coupled to a fluid source 186, which may include water, ethylene glycol, nitrogen ($N_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes.

The chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

In one embodiment, each of the actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator assembly 118 and nut 158 so that as the lead screw 132 is rotated, the coupling 136 is moved along the lead screw 132 to control the elevation of the stator assembly 118 at the interface with the coupling 136. Thus, as the lead screw 132 of one of the actuator assemblies 122 is rotated to produce relative displacement between the nuts 158 of the other actuator assemblies 122, the horizontal plane of the stator assembly 118 changes relative to a central axis of the chamber body 102.

In one embodiment, a motor 138, such as a stepper or servo motor, is coupled to the lead screw 132 to provide controllable rotation in response to a signal by the controller 124. Alternatively, other types of actuator assemblies 122 may be utilized to control the linear position of the stator assembly 118, such as pneumatic cylinders, hydraulic cylinders, ball screws, solenoids, linear actuators and cam followers, among others.

The chamber 100 also includes one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator assembly 118 at each actuator assembly 122 so that both the elevation and the planarity of the substrate support 104 and substrate 140 seated thereon may be adjusted relative to and a central axis of the RTP chamber 100 and/or the radiant heat source 106. For example, the controller 124 may provide signals to raise the substrate support by action of one actuator assembly 122 to correct axial misalignment of the substrate support 104, or the controller may provide a signal to all actuator assemblies 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator assembly 118 outside of the chamber 100. In one embodiment, one or more sensors 116 may be coupled to the stator assembly 118 and are adapted to sense the elevation and/or position of the substrate support 104 (or substrate 140) through the walls 108. In this embodiment, the walls 108 may include a thinner cross-section to facilitate positional sensing through the walls 108.

The chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

The RTP chamber 100 also includes a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

As described herein, the chamber 100 is adapted to receive a substrate in a "face-up" orientation, wherein the deposit receiving side or face of the substrate is oriented toward the cooling block 180 and the "backside" of the substrate is facing the radiant heat source 106. The "face-up" orientation may allow the energy from the radiant heat source 106 to be absorbed more rapidly by the substrate 140 as the backside of the substrate is typically less reflective than the face of the substrate.

Although the cooling block 180 and radiant heat source 106 is described as being positioned in an upper and lower portion of the interior volume 120, respectively, the position of the cooling block 180 and the radiant heat source 106 may be reversed. For example, the cooling block 180 may be sized and configured to be positioned within the inside diameter of the substrate support 104, and the radiant heat source 106 may be coupled to the top 112. In this arrangement, the quartz window 114 may be disposed between the radiant heat source 106 and the substrate support 104, such as adjacent the radiant heat source 106 in the upper portion of the chamber 100. Although the substrate 140 may absorb heat more readily when the backside is facing the radiant heat source 106, the substrate 140 could be oriented in a face-up orientation or a face down orientation in either configuration.

The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

Figure 2:
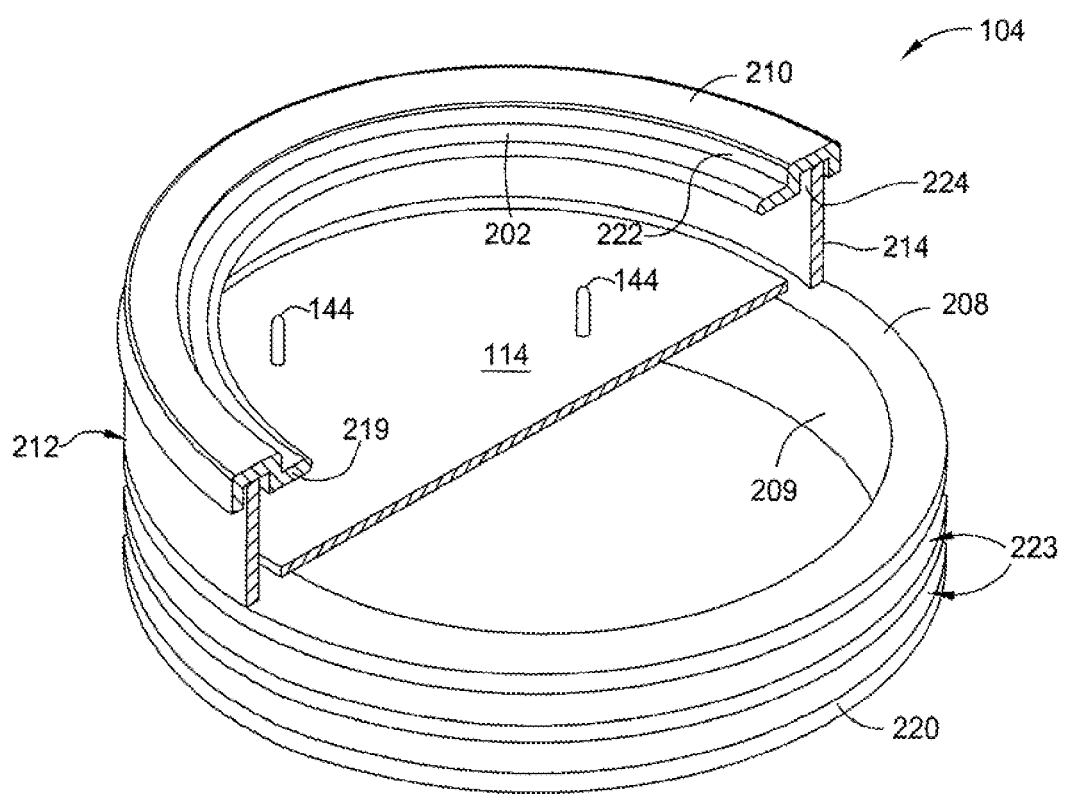
FIG. 2 is an isometric view of one embodiment of a substrate support.

FIG. 2 is an isometric view of one embodiment of a substrate support 104. The substrate support 104 includes an annular body 220 having an inside diameter 209 sized to receive the radiant heat source and other hardware (not shown in this view). The substrate support 104 is at least partially comprised of a magnetic ring section 208 and a support section 212. The magnetic ring section 208 may be at least partially comprised of a magnetic material, such as a ferrous containing material, to facilitate magnetic coupling of the substrate support 104 to the stator assembly 118. The ferrous containing material includes low carbon steel, stainless steel, which may include a plating, such as a nickel plating. In one embodiment, the magnetic ring section 208 is comprised of a plurality of permanent magnets disposed in a polar array about a central axis. The magnetic ring section 208 may additionally include an outer surface having one or more channels 223 formed therein. In one embodiment, the magnetic ring section 208 includes a shaped profile, such as an "E" shape or "C" shape having one or more channels 223 formed therein.

The support section 212 is generally adapted to minimize energy loss, such as heat and/or light, from the radiant heat source 106, such that a substantial portion of energy from the radiant heat source 106 is contained within the region between the lower surface of the substrate 140 and the upper end of the radiant heat source 106 (not shown in this Figure). The support section 212 may be an annular extension 214 extending from an upper surface of the magnetic ring section 208. The support section 212 may also include a support ring 210 that, in one embodiment, facilitates alignment and provides a seating surface 202 for the substrate 140. In one embodiment, at least a portion of the support ring 210 is made from a material that is transparent to energy from the radiant heat source 106, such as a quartz material. In another embodiment, the support ring 210 comprises a silicon carbide material that may be sintered. The support ring 210 may further include an oxide coating or layer, which may comprise nitrogen. An example of a support ring 210 that may be used is described in U.S. Pat. No. 6,888,104, filed Feb. 5, 2004, and issued on May 3, 2005, which is incorporated by reference in its entirety.

The support ring 210 generally includes an inner wall 222 and a support lip 219 extending inwardly from the inner wall 222. The inner wall 222 may be sized slightly larger than the substrate in a stepwise or sloped fashion and facilitates alignment and/or centering of the substrate 140 when the substrate support 104 is raised. The substrate may then be seated on the support lip 219 and substrate centering is maintained during lifting and/or rotation of the substrate support 104. The support ring 210 may also include an outer wall that extends downward from the upper surface of the support ring 210 opposite the inner wall 222. The area between the outer wall and inner wall 222 forms a channel 224 that facilitates alignment of the support ring 210 on the annular extension 214. The support section 212 may be coupled to the magnetic ring section 208 by fastening, bonding, or gravitationally, and is adapted to support the substrate 140 during processing. In one embodiment, the support ring 210 functions as an edge ring and may be gravitationally attached to the annular extension 214 for easy removal and replacement.

The support section 212 may be fabricated from a material that reduces potential scratching, chemical or physical contamination, and/or marring of the substrate, for example, materials such as silicon carbide, stainless steel, aluminum, ceramic, or a high temperature polymer may be used. Alternatively, the support section 212 may be fabricated as a unitary member from the material of the magnetic ring section 208. At least a portion of the support section 212 may be fabricated or coated with a reflective material, or made of or coated with a black material to absorb heat similar to a black body, depending on process parameters. It is to be noted that a black material as used herein may include dark colors, such as the color black, but is not limited to dark colored materials or coatings. More generally, a black material, a black finish, or a black coating refers to the lack of reflectivity or the ability the material, finish, or coating to absorb energy, such as heat and/or light, similar to a black body.

Figure 3:
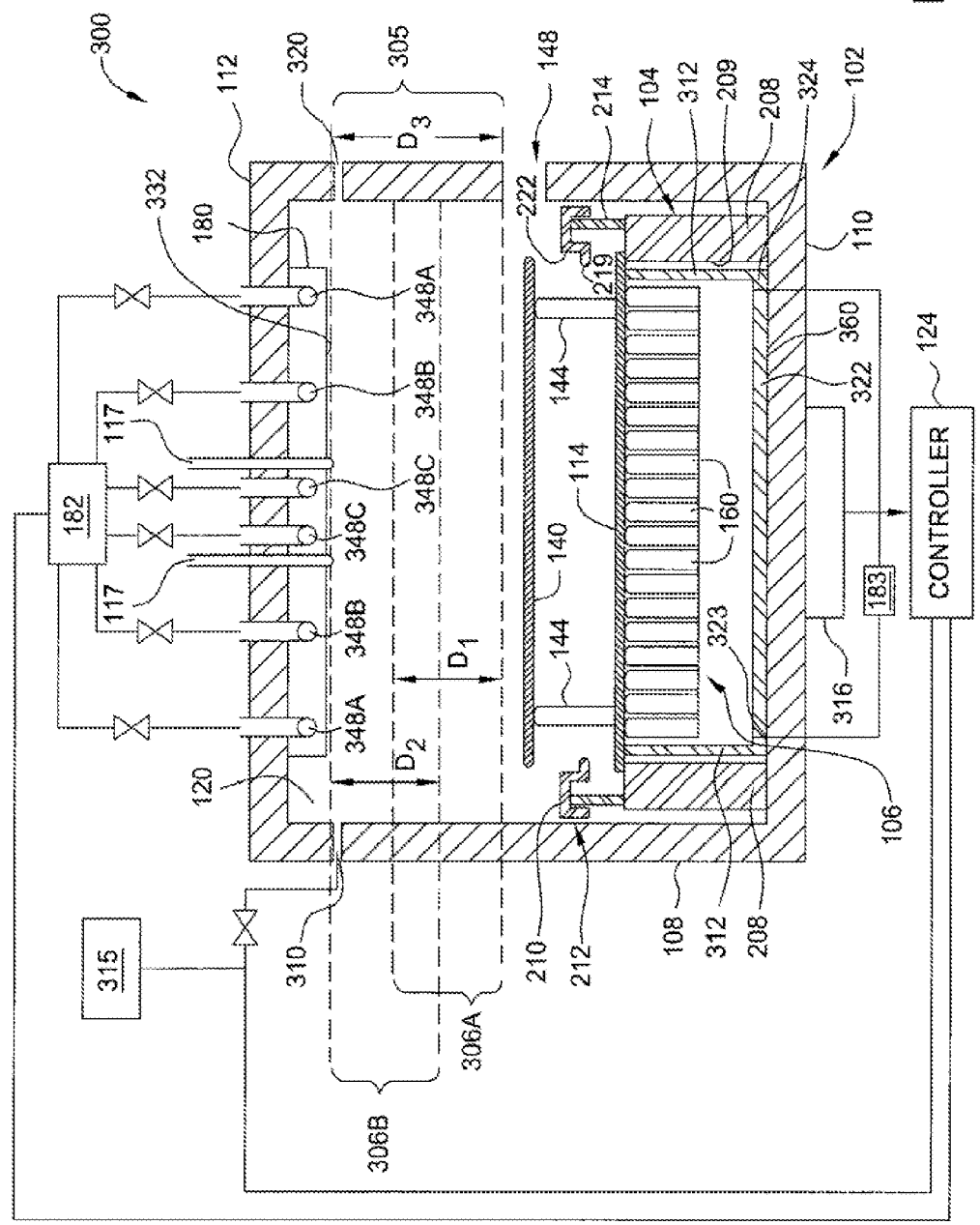
FIG. 3 is a schematic side view of another embodiment of a RTP chamber.

FIG. 3 is a schematic side view of another embodiment of a RTP chamber 300 which includes a chamber body 102, having walls 108, a bottom 110, and a top 112, defining an interior volume 120 as in FIG. 1. The chamber 300 also includes a contactless or magnetically levitated substrate support 104 as in FIG. 1, but the stator and other components outside the chamber 100 are not shown for clarity. In this embodiment, the substrate support 104 is depicted in an exchange position, wherein the plurality of lift pins 144 is supporting the substrate 140 to facilitate transfer of the substrate.

In this embodiment, a portion of the substrate support 104 and/or the magnetic ring section 208 may rest at or near an upper surface of the bottom 110 of the chamber body 102, and the window 114 is supported by one of the upper surface of the magnetic ring section 208 and/or a sidewall 312 coupled to or otherwise supported by the upper surface of the bottom 110. The sidewall 312 may be sidewalls of a coolant assembly 360 around a portion of the radiant heat source 106 disposed in the inside diameter of the substrate support 104, or the sidewalls 312 may be support members coupled to the upper surface of the bottom 110 within the inside diameter of the substrate support 104 and outside of the coolant assembly 360. An adaptor plate 316 may also be coupled to the chamber bottom 110 to facilitate connection of wires and other support devices for the radiant heat source 106 and/or the coolant assembly 360.

The support section 212 may be an annular extension 214 extending from an upper surface of the substrate support 104 or the magnetic ring section 208. The support section 212 may also include a support ring 210 that provides alignment and a seating surface for the substrate 140. The support ring 210 includes an inner wall 222 and a support lip 219 extending inwardly from the inner wall 222. The inner wall 222 may be sized slightly larger than the substrate and facilitates alignment and/or centering of the substrate 140 when the substrate support 104 is raised. The substrate 140 may then be seated on the support lip 219 and substrate centering is maintained during lifting and/or rotation of the substrate support 104.

In one embodiment, the cooling block 180 includes a plurality of coolant channels 348A-348C for circulating a cooling fluid as described above. The coolant channels may be separate channels or discrete flow paths, or the coolant channels may comprise a plurality of closed flow paths coupled to the coolant source 182. In one embodiment, the cooling block 180 comprises multiple cooling zones, such as an outer zone defined generally by the coolant channel 348A, an inner zone defined generally by coolant channel 348C, and an intermediate zone generally defined by coolant channel 348B. The outer zone may correspond to the periphery of the substrate 140 while the inner and intermediate zones may correspond to a central portion of the substrate 140. The coolant temperature and/or coolant flow may be controlled in these zones to provide, for example, more cooling on the periphery of the substrate 140 relative to the center of the substrate. In this manner, the cooling block 180 may provide enhanced temperature control of the substrate 140 by providing more or less cooling in regions of the substrate where cooling is needed or desired.

The cooling block 180 may be formed from a material such as aluminum, stainless steel, nickel, a ceramic, or a process resistant polymer. The cooling block 180 may comprise a reflective material, or include a reflective coating configured to reflect heat onto the substrate surface. Alternatively, the cooling block 180 may comprise a black material (such as a black material configured to absorb energy substantially similar to a black body) or otherwise coated or finished with a black material or surface that is configured to absorb heat from the substrate and/or the interior volume 120. The cooling block 180 may also include a face or outer surface 332 that may be roughened or polished to promote reflectivity or absorption of radiant energy in the form of heat and/or light. The outer surface 332 may also include a coating or finish to promote reflectivity or absorption, depending on the process parameters. In one embodiment, the cooling block 180 may be a black material or a material resembling a black material, or otherwise coated or finished with a black material or resembling a black material, to have an emissivity or emittance near 1, such as an emissivity between about 0.70 to about 0.95.

As shown in FIG. 3, the interior volume 120 comprises a temperature transition zone 305, or processing zone depicted as distance $D_3$, which includes a heating region 306A and a cooling region 306B that the substrate 140 may be exposed to during processing. The regions 306A, 306B enable rapid heating and rapid cooling of the substrate 140 during processing in the interior volume 120. As an example, heating region 306A may enable a temperature on the face of the substrate 140 that is between about 450° C. to about 1400° C. during processing, and the cooling region 306B may cool the face of the substrate 140 to about room temperature or lower during processing, depending on process parameters.

For example, the substrate may be transferred to the RTP chamber at room temperature, or some temperature above room temperature provided by a heating means in a load lock chamber, or other peripheral chamber or transfer device. The temperature of the substrate before, during, or after transfer of the substrate to the RTP chamber may be referred to as the first or introduction temperature, from which the RTP process may be initiated. In one embodiment, the introduction temperature may be between about room temperature, to about 600° C. Once the substrate is introduced to the chamber, the substrate may be rapidly heated, taking the temperature of the substrate from the introduced temperature to a second temperature of between about 800° C. to about 1200° C., such as about 900° C. to about 1150° C. In one embodiment, power to the radiant heat source is varied and monitored, using feedback from the sensors 117, to enable a second temperature of about 900° C. to about 1150° C. across the substrate in a heating step or first heating period.

In one embodiment, the first heating period is configured to raise the temperature of the substrate from the introduction temperature to about 900° C. to about 1150° C. across the substrate in about 2 minutes or less, such as between about 50 seconds and about 90 seconds, for example, between about 55 seconds and about 75 seconds. After the substrate has reached the second temperature in the heating period, a spike or transition period may begin, which includes a second heating period. The second heating period may include heating the substrate to a third temperature of about 25° C. to about 100° C. higher than the second temperature. The transition period also includes lowering the temperature of the substrate to a fourth temperature, which is about 25° C. to about 100° C. lower than the third temperature. In one embodiment, the third temperature and the fourth temperature are within about 5° C. to about 20° C. of each other, and in another embodiment, the third temperature and the fourth temperature are substantially equal. The transition period may include a third period of about 3 seconds or less, such as about 0.1 seconds to about 2 seconds, for example, between about 0.3 seconds to about 1.8 seconds.

After the transition period, the substrate may be placed adjacent the cooling block 180 and rapidly cooled by one or both of the cooling block 180 and coolant source 315 (described in more detail below). The substrate may be cooled to a temperature substantially equal to the first or introduction temperature in a fourth period that may be less than 10 seconds, such as about 2 seconds to about 6 seconds. The substrate may be cooled rapidly to a desired temperature, including a temperature at or near room temperature, or be cooled to a temperature above room temperature that enables transfer, which may enhance throughput.

The rapid heating and cooling of the substrate, as described above, provides many benefits. The temperature of the substrate is constantly monitored by feed back from the sensors 117, and enhanced control of the substrate temperature may be facilitated by moving the substrate relative the cooling block 180 and/or the radiant heat source 106. Dopant diffusion control may be enhanced by the rapid and controlled heating and cooling of the substrate, and device performance may be improved. Additionally, the lessened heating and cooling times may increase throughput.

To enable the rapid heating and cooling of the substrate, the substrate may travel in the temperature transition zone 305. The travel of the substrate 140 in the interior volume 120 and the regions 306A, 306B facilitate a sharper transition and/or a lower residence time between heating and cooling of the substrate. In one example, once the substrate 140 is placed in a processing position, the heating region 306A of the temperature transition zone 305 may include a travel distance $D_1$ for the substrate 140 (or substrate support 104), for example, between about 0.5 inches to about 1.5 inches. The cooling region 306B of the temperature transition zone may include a travel distance $D_2$ for the substrate 140 (or substrate support 104) between about 0.5 inches to about 1.5 inches. In one embodiment, the total travel of the substrate 140 (or substrate support 104) within the interior volume, such as between the radiant heat source 106 and the cooling block 180, is between about 0.75 inches to about 3.25 inches, for example, between about 1.0 inches and about 2.75 inches, such as about 2 inches. In one embodiment, the distance $D_1$ comprises about one half of the distance $D_3$, and the distance $D_2$ comprises about one half of the distance $D_3$. The substrate support 104 may be configured to raise the substrate to a position that is in close proximity to the substrate 140, depending on the flatness of the substrate and other physical properties of the substrate, and the mechanical characteristics of the substrate support. Assuming the substrate has a suitable flatness, and the substrate support 104 and substrate disposed thereon is substantially parallel to the cooling block 180, the substrate may be raised to be within about 0.005 inches to about 0.025 inches from the lower surface of the cooling block 180. Bringing the substrate in close proximity to the cooling block enables rapid heat transfer and enhanced cooling of the substrate.

In one embodiment, the chamber 300 includes a gas port 310 coupled to a coolant source 315. The gas port 310 may be a manifold or a plurality of openings that are formed or otherwise coupled to the upper portion of the chamber wall 108, and may be formed as, or adapted to couple to, a nozzle that enables laminar flow through the cooling region 306B, for example adjacent to the outer surface 332 of the cooling block 180. To enable a more enhanced flow path, the chamber also includes an exit port 320 formed in the chamber wall 108, typically opposing the gas port 310. The exit port 320 may be coupled to a vacuum source configured to assist the atmosphere control system 164 (FIG. 1) and remove excess gas provided by the gas port 310. The coolant source 315 includes a cooling fluid, such as helium (He), nitrogen ($N_2$), or other suitable cooling fluid, and is directed or configured to flow within the cooling region 306B. The cooling fluid from the gas port 310 enables more rapid cooling of the substrate 140 when the substrate is positioned in the cooling region 306B.

As described in reference to FIG. 1, the radiant heat source 106 is coupled to a coolant assembly 360 that is adapted to maintain a suitable temperature and/or cool the honeycomb tubes 160 of the radiant heat source 106. The coolant assembly 360 includes sidewalls 312 and a bottom 314 that is adapted to contain a fluid. The bottom 314 includes ports 323 and 324 that are configured to supply and remove coolant fluid from the coolant source 183, which may be water, ethylene glycol, or other suitable cooling fluid. The coolant assembly 360 may also include a plurality of fluid channels formed therein (described in reference to FIG. 4) for enhanced thermal transfer from the cooling fluid and the radiant heat source 106.

Figure 4:
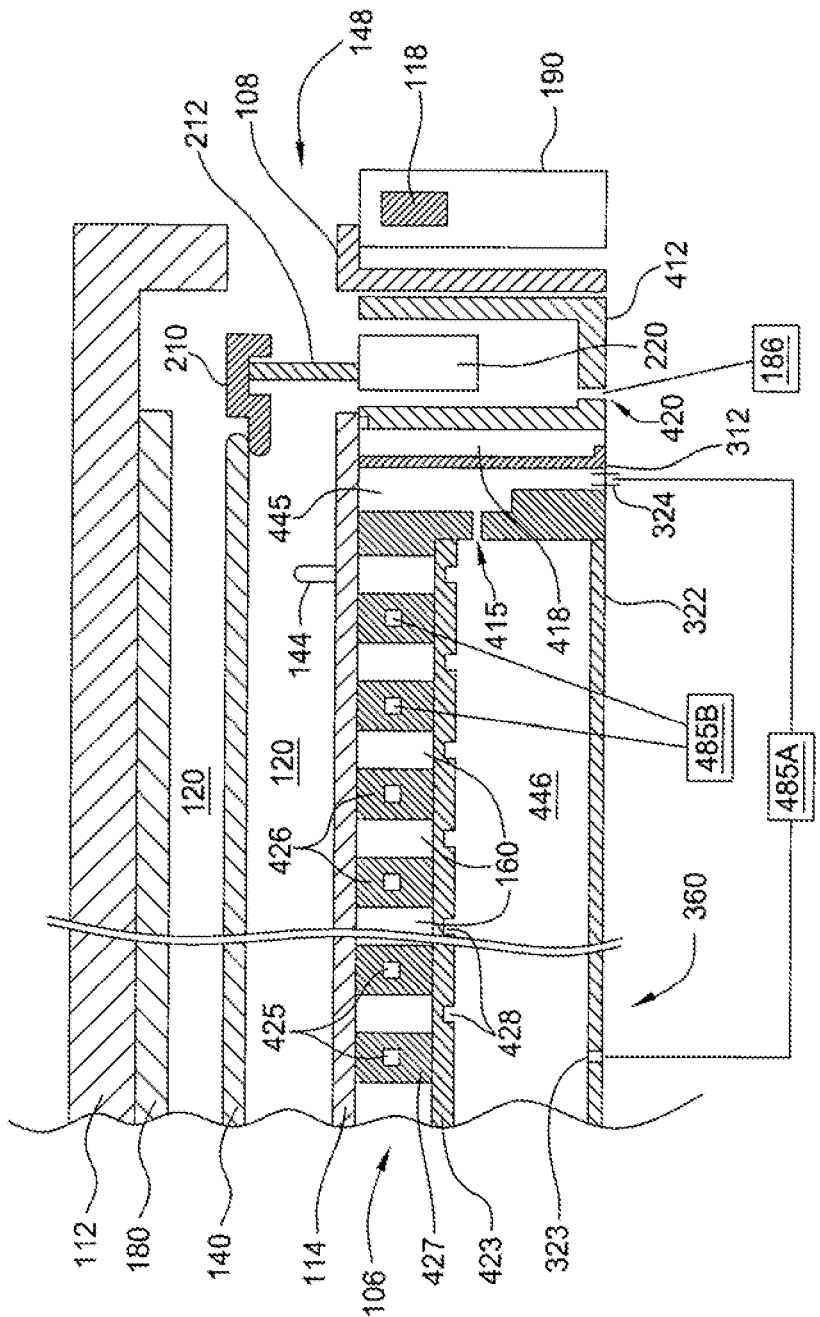
FIG. 4 is a partial schematic side view of another embodiment of a RTP chamber.

FIG. 4 is partial side view of another embodiment of a RTP chamber in a processing position and details of the coolant assembly 360 will be described. The coolant assembly 360 includes a bottom 322 and sidewalls 312 as shown in other Figures, and also includes a body 427, which comprises a plurality of partitions 426 separating the plurality of honeycomb tubes 160. The body may also comprise a plate 423 opposing the bottom 322, to form a void 446 therebetween, which is configured to contain the coolant from a first coolant source 485A and separate the void 446 from the plurality of honeycomb tubes 160. The void 446 is in communication with the coolant source 485A by a port 324 coupled to the bottom 322 and the port 324 is in communication with a plenum 445 that is in fluid communication with the void 446 by a plenum port 415. The plate 423 may include a plurality of channels or grooves 428 formed therein to increase the surface area available to the cooling fluid, thus enhancing heat dissipation from the radiant heat source 106.

In operation, a cooling fluid is supplied from the first source 485A to the void 446 by the port 323, and the coolant at least partially fills the void 446. The coolant may be continually flowed into the void to dissipate heat and exits the void through the plenum port 415 to the plenum 445. The coolant may be removed from the plenum 445 by the port 324 and returned to the first source 485A. The coolant may be replenished and/or cooled before cycling through the void 446. In this manner, the temperature of the radiant heat source 106 is controlled.

The coolant assembly 360 may also includes a plurality of fluid channels 425 formed in at least a portion of the plurality of partitions 426. The fluid channels 425 are configured to flow a cooling fluid, such as water, ethylene glycol, nitrogen ($N_2$), helium (He), or other fluid used as a heat exchange medium, from a second coolant source 485B. The fluid channels 425 are coupled to the second coolant source 485B by at least one inlet and outlet (not shown). The flowing of coolant from the first and second sources 485A, 485B facilitates enhanced temperature control of the radiant heat source 106.

The chamber 100 also includes a magnetically levitated or contactless substrate support 104 having a support ring 210 and a support section 212 configured as an annular extension coupled to an annular body 220 disposed in a channel or trough 412. The trough 412 is coupled to a fluid source 186 through a port 420 for supplying a coolant to the trough 412, thus dissipating heat that may be transferred from the radiant heat source 106 and/or heat created by rotation of the annular body 220 during processing. The fluid source 186 may include cooling fluids, such as water, ethylene glycol, nitrogen ($N_2$), helium (He), or other fluid used as a heat exchange medium. A gap 418 may also be formed between the sidewall 312 of the coolant assembly 360 and a sidewall of the trough 412 to facilitate insulation between the annular body 220 of the substrate support 104 and the radiant heat source 106.

While the foregoing is directed to embodiments of the present invention, other and further embodiments of the invention may be devised without departing from the basic scope thereof, and the scope thereof is determined by the claims that follow.

The invention claimed is:

1. A method for thermally treating a substrate, comprising:
providing a chamber having a levitating substrate support disposed therein;
sensing a position of the substrate support within the chamber;
adjusting the position of the substrate support within the chamber;
moving the substrate to a first position;
heating the substrate in the first position;
moving the substrate to a second position adjacent an active cooling means; and
cooling the substrate in the second position, wherein the first and second positions are disposed in the chamber.

2. The method of claim 1, wherein the heating comprises a time period of 2 minutes or less.

3. The method of claim 1, wherein the cooling comprises a time period of 10 seconds or less.

4. The method of claim 1, wherein the first position and second position each comprise a distance equal to one half of the sum of the first position and the second position.

5. The method of claim 1, wherein the cooling means comprises at least one cooling zone disposed in the chamber.

6. The method of claim 1, wherein sensing the position of the substrate support comprises sensing the diameter of the substrate.

7. A method for thermally treating a substrate, comprising:
providing a chamber having a levitating substrate support disposed therein;
sensing a position of the substrate support within the chamber;
adjusting the position of the substrate support within the chamber;
moving the substrate to a first position;
heating the substrate in the first position;
moving the substrate to a second position adjacent an active cooling means; and
cooling the substrate in the second position, wherein the first and second positions are in the chamber, wherein the first position and second position each comprise a distance equal to one half of the sum of the first position and the second position.

8. The method of claim 7, wherein the heating comprises a time period of 2 minutes or less.

9. The method of claim 7, wherein the cooling comprises a time period of 10 seconds or less.

10. The method of claim 7, wherein the cooling means comprises at least one cooling zone disposed in the chamber.

11. The method of claim 7, wherein sensing the position of the substrate support comprises sensing the diameter of the substrate.

12. A method for thermally treating a substrate, comprising:
   providing a chamber having a levitating substrate support disposed therein;
   sensing a position of the substrate support within the chamber;
   adjusting the position of the substrate support within the chamber;
   moving the substrate to a first position;
   heating the substrate in the first position;
   moving the substrate to a second position adjacent an active cooling means; and
   cooling the substrate in the second position, wherein the first and second positions are in the chamber, wherein sensing the position of the substrate support comprises sensing the diameter of the substrate.

13. The method of claim 12, wherein the heating comprises a time period of 2 minutes or less.

14. The method of claim 12, wherein the cooling comprises a time period of 10 seconds or less.

15. The method of claim 12, wherein the cooling means comprises at least one cooling zone disposed in the chamber.

16. The method of claim 12, wherein the first position and second position each comprise a distance equal to one half of the sum of the first position and the second position.

* * * * *